United States Patent
Suzawa et al.

(10) Patent No.: US 6,562,669 B2
(45) Date of Patent: May 13, 2003

(54) SEMICONDUCTOR DEVICE AND METHOD OF MANUFACTURING THE SAME

(75) Inventors: Hideomi Suzawa, Kanagawa (JP); Akira Tsunoda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/007,361

(22) Filed: Nov. 5, 2001

(65) Prior Publication Data

US 2002/0053669 A1 May 9, 2002

(30) Foreign Application Priority Data

Nov. 7, 2000 (JP) ........................................ 2000-338572

(51) Int. Cl.⁷ .............................................. H01L 21/00
(52) U.S. Cl. ........................................ 438/158; 438/159
(58) Field of Search .................................. 438/158, 159

(56) References Cited

U.S. PATENT DOCUMENTS

| | | | |
|---|---|---|---|
| 5,523,257 A | 6/1996 | Yamazaki et al. | 437/173 |
| 5,736,750 A | 4/1998 | Yamazaki et al. | 257/59 |
| 5,767,547 A | 6/1998 | Merchant et al. | 257/347 |
| 5,891,766 A | 4/1999 | Yamazaki et al. | 438/163 |
| 6,114,728 A | 9/2000 | Yamazaki et al. | 257/347 |
| 6,121,660 A | 9/2000 | Yamazaki et al. | 257/348 |
| 6,252,248 B1 * | 6/2001 | Sano et al. | |
| 6,259,138 B1 * | 7/2001 | Ohtani et al. | |
| 2002/0043660 A1 * | 4/2002 | Yamazaki et al. | |

OTHER PUBLICATIONS

U.S. patent application No. 09/619,732 (pending) to Yamazaki et al filed Jul. 19, 2000, including specification, abstract, claims, drawings and PTO filing receipt.

* cited by examiner

Primary Examiner—John F. Niebling
Assistant Examiner—Stanetta Isaac
(74) Attorney, Agent, or Firm—Cook, Alex, McFarron, Manzo, Cummings & Mehler, Ltd.

(57) ABSTRACT

There is provided a structure of a pixel TFT (n-channel type TFT) in which an off current value is sufficiently low. In impurity regions, a concentration distribution of an impurity element imparting one conductivity type is made to have a concentration gradient, the concentration is made low at a side of a channel formation region, and the concentration is made high at the side of an end portion of a semiconductor layer.

20 Claims, 10 Drawing Sheets

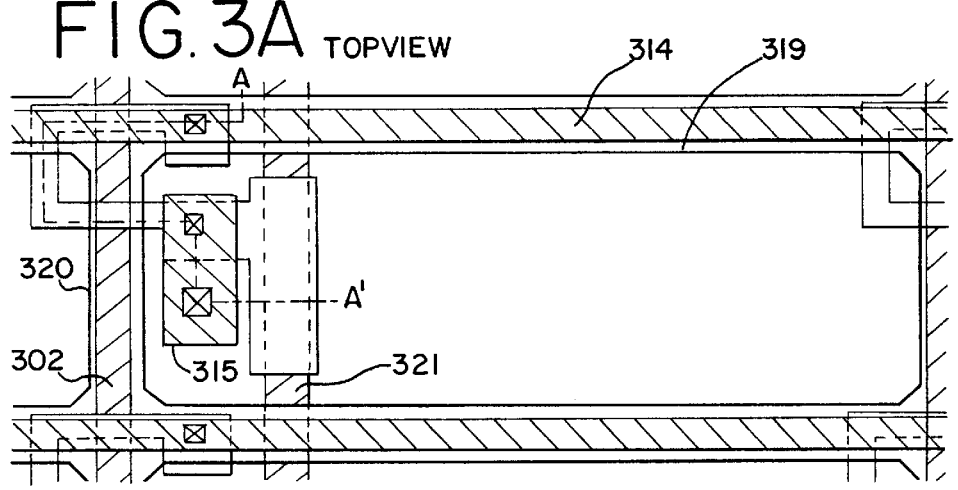
FIG. 3A TOPVIEW
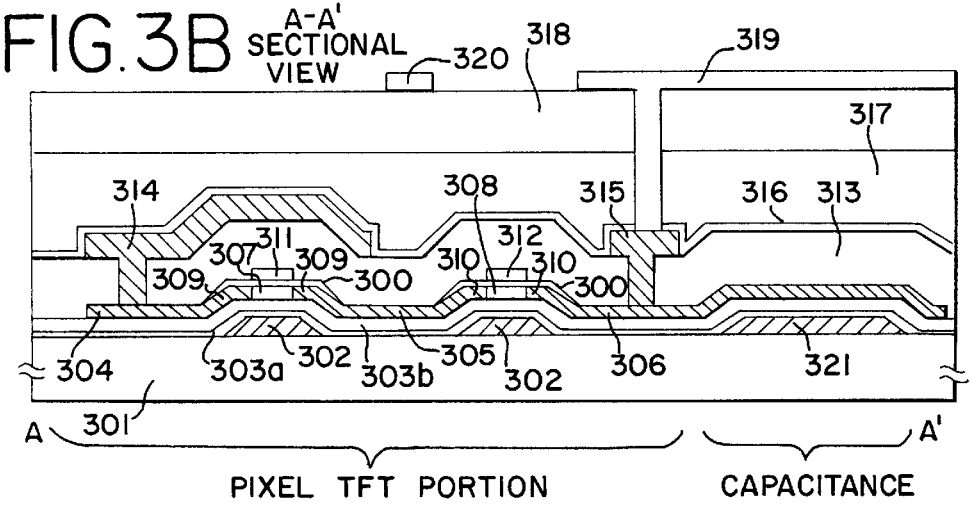
FIG. 3B A-A' SECTIONAL VIEW
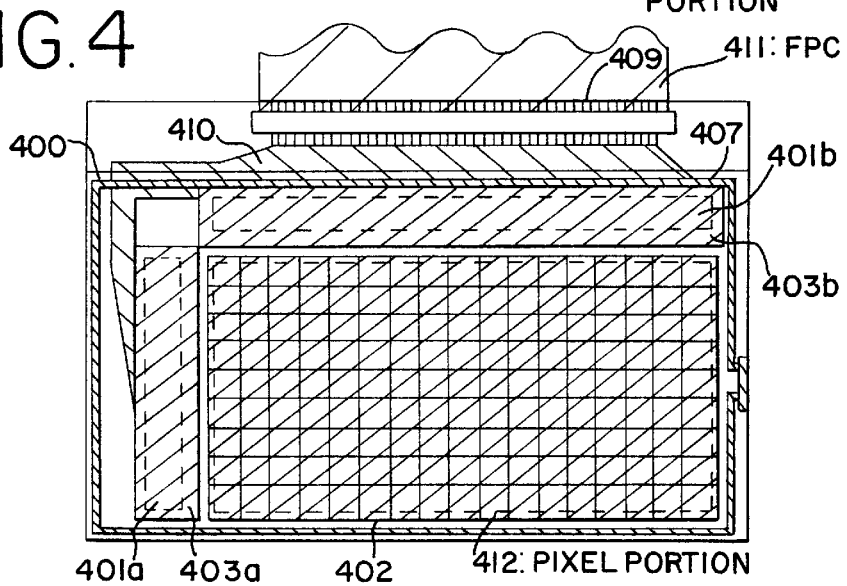
FIG. 4

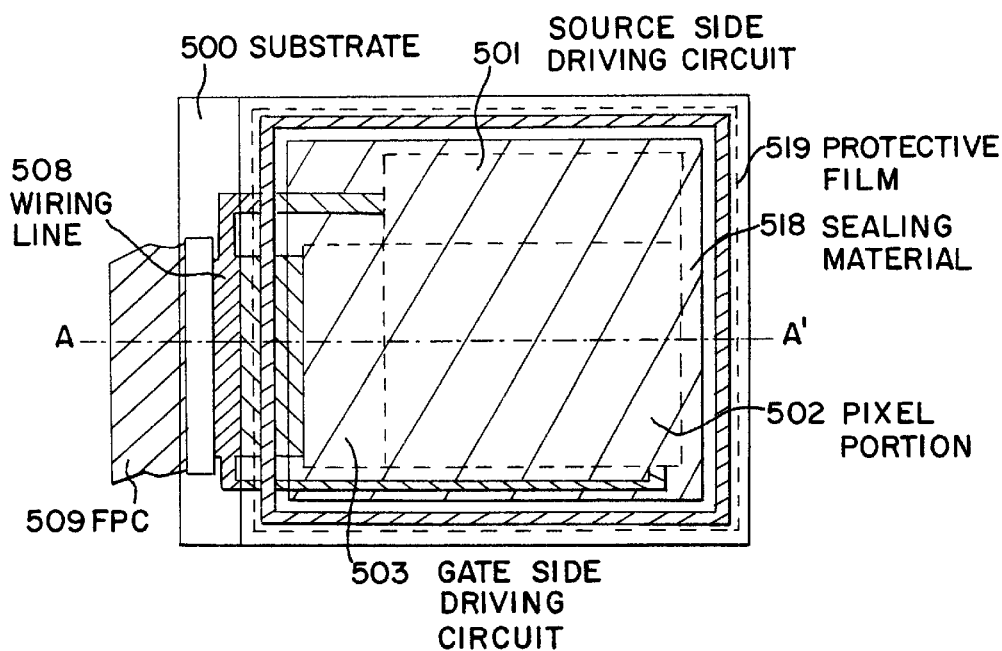
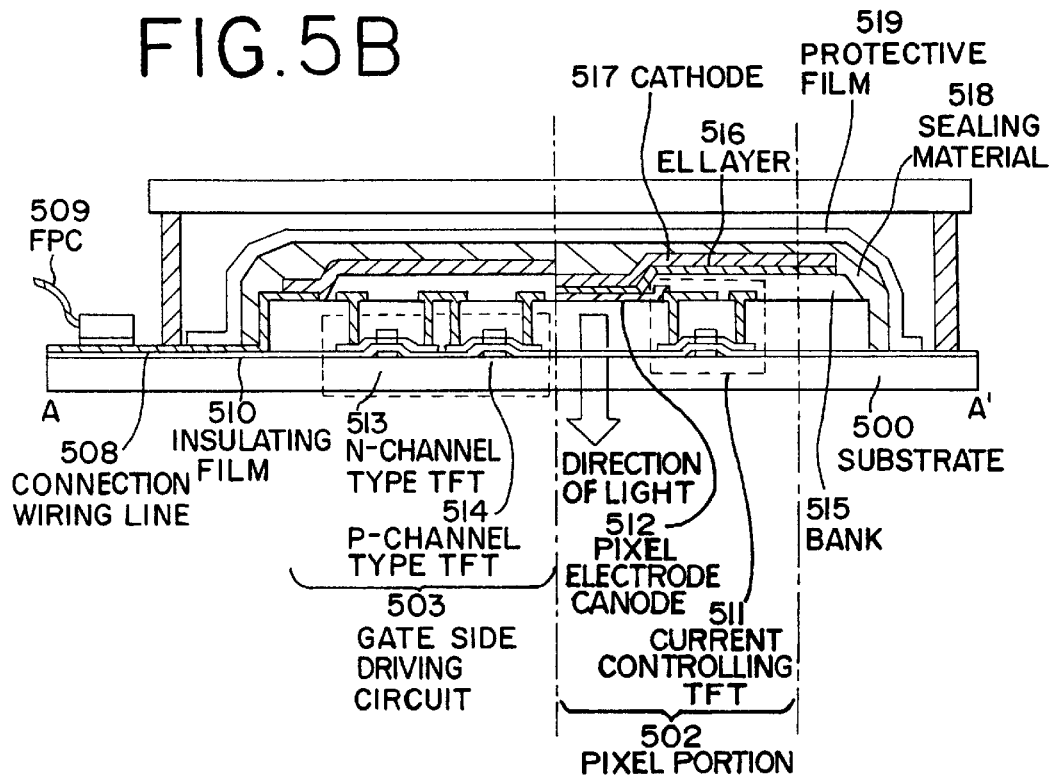

PROJECTION SYSTEM (3-PLATE TYPE)

OPTICAL LIGHT SOURCE SYSTEM

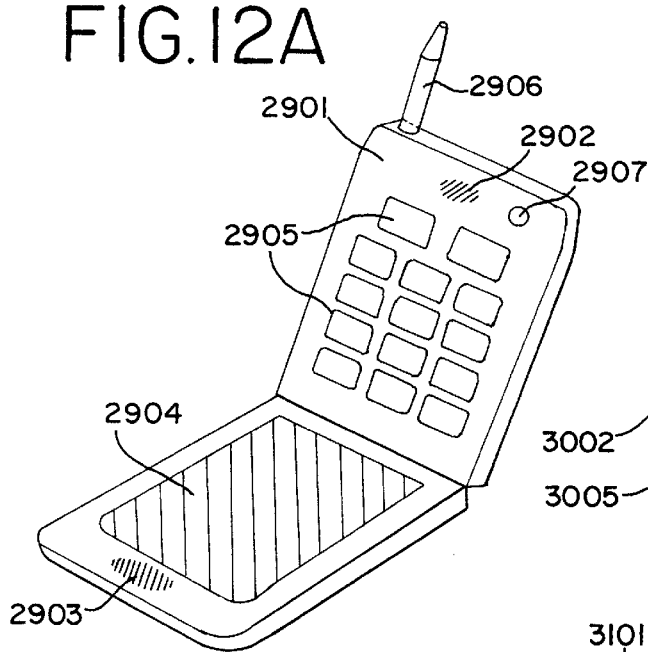
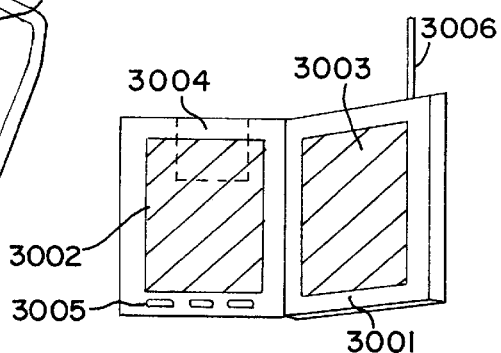
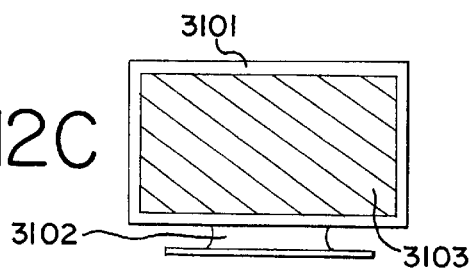
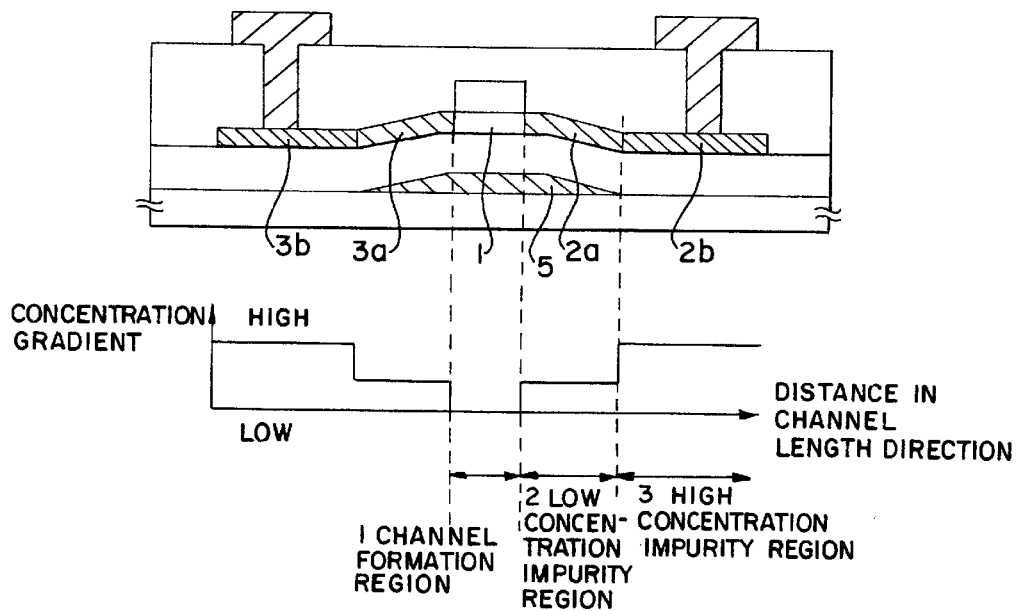

SEMICONDUCTOR DEVICE AND METHOD OF MANUFACTURING THE SAME

BACKGROUND OF THE INVENTION

1. Field of the Invention

The present invention relates to a semiconductor device including a circuit constituted by thin film transistors (hereinafter referred to as TFTs) and a method of manufacturing the same. For example, the present invention relates to an electro-optical device typified by a liquid crystal display panel and an electronic instrument incorporating such an electro-optical device as a part.

Note that, the "semiconductor device" in the present specification indicates any device which can function by using semiconductor characteristics, and any of an electro-optical device, a semiconductor circuit and an electronic instrument is a semiconductor device.

2. Description of the Related Art

In recent years, attention has been paid to a technique for constructing a thin film transistor (TFT) by using a semiconductor thin film (thickness of about several nm to several hundreds of nm) formed on a substrate having an insulating surface. The thin film transistor is widely used for an electric device such as an IC or an electro-optical device, and particularly its development as a switching element of an image display device has been hastened. The thin film transistor includes a top gate type TFT and a bottom gate type TFT.

Since the bottom gate type TFT is little influenced by impurity diffusion from a substrate to a semiconductor layer as compared with the top gate type TFT, its reliability is high. A general structure thereof is such that an impurity region overlaps with a gate electrode.

The development of a semiconductor device including a large area integrated circuit formed of these TFTs has been advanced.

An active matrix type liquid crystal display device, an EL display device, and a direct-contact image sensor are known as its typical examples. Especially, since a TFT (hereinafter referred to as a polysilicon TFT) using a crystalline silicon film (typically a polysilicon film) as an active layer has a high field effect mobility, it is also possible to form circuits having various functions.

For example, in the active matrix type liquid crystal display device, in every function block, a pixel circuit for carrying out an image display, and a driving circuit for controlling the pixel circuit, such as a shift register circuit using a CMOS circuit as a base, a level shifter circuit, a buffer circuit, and a sampling circuit, are formed on one substrate.

In the pixel circuit of the active matrix type liquid crystal display device, a TFT (pixel TFT) is disposed in each of several tens to several millions of pixels, and a pixel electrode is provided at each of the pixel TFTs. A counter electrode is provided on a counter substrate side with a liquid crystal sandwiched therebetween, and forms a kind of capacitor using the liquid crystal as a dielectric. A voltage applied to each pixel is controlled by a switching function of the TFT, and an electric charge to the capacitor is controlled, so that the liquid crystal is driven and the amount of transmitted light is controlled to display an image.

The pixel TFT is made of an n-channel type TFT, and, as a switching element, applies the voltage to the liquid crystal to drive it. Since the liquid crystal is driven by an alternating current, a system called frame inversion driving is often adopted. In this system, in order to suppress consumed electric power to be low, it is important that characteristics required for the pixel TFT are such that an off current value (drain current flowing when the TFT is in an off operation) is made sufficiently low.

SUMMARY OF THE INVENTION

The present invention provides a technique for solving such problems, and an object of the present invention is to improve operation characteristics of a semiconductor device and to reduce consumed electric power in an electro-optical device typified by an active matrix type liquid crystal display device manufactured by using TFTs and in a semiconductor device.

Particularly, an object of the present invention is to obtain a structure of a pixel TFT (n-channel type TFT) in which an off current value is sufficiently low, and the ratio of an on current value to the off current value is high.

As shown in FIG. 1A, the present invention is characterized by including a region 102a having such a concentration gradient in an impurity region 102 that as a distance (distance in a channel length direction) from a channel formation region becomes larger, a concentration of an impurity element imparting one conductivity type is increased.

That is, the invention is characterized by including an impurity region in which as a distance from an end portion of a gate electrode 105 becomes larger toward a peripheral portion (peripheral portion in a section cut in the channel length direction) of a semiconductor layer in the channel length direction, the concentration of the impurity element (phosphorus) is gradually increased. Accordingly, in the impurity region, its electric resistance is large at the side of the channel formation region, and is low at the side of the peripheral portion of the semiconductor layer.

Further, in the present invention, since the concentration is gradually increased in the impurity region, there is no definite boundary, and in the present specification, a region in the impurity region 102 in which its impurity concentration is $1 \times 10^{20}/cm^3$ or higher is called a drain region 102b.

Further, although the drain side has been explained in the above, it is desirable that the source side also has the same structure. In the impurity region at the source side, there is formed a region 103a having such a concentration gradient that as the distance from the channel formation region becomes larger, the concentration of the impurity element imparting one conductivity type is increased. Further, in the present specification, in the source side impurity region, a region having an impurity concentration of $1 \times 10^{20}/cm^3$ or higher is called a source region 103b.

The present invention is characterized in that the regions 102a and 103a having such concentration gradients are intentionally formed to realize a TFT in which an off current value is considerably low and the ratio of an on current value to the off current value is high. The gate electrode 105 overlaps with the channel formation region 101 and the impurity region 102a through a gate insulating film 104. Note that, in FIG. 1A, reference numeral 100 designates a substrate having an insulating surface; 108, an interlayer insulating film; 109, a source electrode; and 110, a drain electrode. Further, as shown in FIG. 7, a structure may be adopted in which a gate electrode does not overlap with an impurity region.

In a conventional TFT structure, as shown in FIG. 13, there is a boundary due to a definite concentration difference, and the concentration is different like a staircase among a channel formation region 1, a low concentration impurity region 2, and a high concentration impurity region 3. That is, there is a discontinuous concentration distribution. In addition, the concentration in each region is almost constant. Accordingly, in the prior art, since the concentration difference at the boundary between the high concentration impurity region 3 and the low concentration impurity region 2, and the concentration difference at the boundary between the low concentration impurity region 2 and the channel formation region 1 are relatively large, high electric field concentration is generated in the vicinity of each of the boundaries.

Since the off current flows by quantum mechanical effects such as tunneling between bands, it is conceivable that the off current is mainly effected by an electric field. Accordingly, the electric field concentration generated at the boundary causes the off current value of the TFT to increase. Especially, in the conventional TFT structure, there has been a problem in that a high electric field is concentrated by the large concentration difference at the boundary between the channel formation region and the low concentration impurity region.

On the other hand, in the present invention, by providing the impurity region in which the concentration is continuously increased, a definite boundary is eliminated, and the electric field concentration generated in the vicinity of a boundary portion is relieved, so that the TFT structure having a low off current value can be obtained.

In the present invention, as shown in FIG. 1A, although it is most desirable that such a concentration gradient as to completely eliminate a boundary due to a concentration difference of an impurity element in a semiconductor layer is formed in the impurity region 102 (range of $1 \times 10^{15}/cm^3$ to $1 \times 10^{21}/cm^3$), the effect of the present invention can also be obtained by lessening the concentration difference between the channel formation region 101 and the impurity region 102a in the vicinity of the channel formation region. Further, the effect of the present invention can also be obtained by lessening the concentration difference at the boundary between the impurity region 102b and the impurity region 102a in the vicinity of the above impurity region.

FIG. 1B shows simulation results in the case where the TFT structure is made one shown in FIG. 1A and is designed to have channel length L=6 μm, channel width W=4 μm, film thickness of the gate insulating film 104=115 nm, film thickness of a polysilicon layer=45 nm, the region 102a (width: 1.5 μm) having a concentration gradient within the range of an impurity concentration (P concentration) of $1 \times 10^{17}/cm^3$ to $1 \times 10^{18}/cm^3$, the impurity region 102b having an impurity concentration (P concentration) of $1 \times 10^{19}/cm^3$, and a carrier concentration (B concentration) of the channel formation region 101=$2 \times 10^{16}/cm^3$. In the simulation results, the vertical axis indicates the intensity of an electric field E (V/cm) of the surface of the semiconductor layer, and the horizontal axis indicates the distance (μm) from the channel formation region. A solid line in FIG. 1B shows the state of electric field concentration onto the impurity region of the present invention.

Further, as an example of the prior art, a dotted line in FIG. 1B indicates the state of electric field concentration onto the low concentration impurity region 2 when the concentration distribution in the semiconductor layer of the TFT is made the distribution shown in FIG. 13.

As shown in FIG. 1B, the present invention is provided with at least the impurity region having the concentration gradient within the range of the impurity concentration (P concentration) of $1 \times 10^{17}/cm^3$ to $1 \times 10^{18}/cm^3$, so that the electric field intensity of the semiconductor layer surface can be made gentler than the prior art. Therefore, according to the present invention, high electric field concentration is not generated all over the semiconductor layer, and a TFT having a low off current value can be obtained.

The structure of the present invention disclosed in the present specification relates to a semiconductor device including a TFT which includes a gate electrode formed on an insulating surface, an insulating film formed on the gate electrode, and a semiconductor layer formed on the insulating film, characterized in that the semiconductor layer includes a channel formation region overlapping with the gate electrode, and an impurity region formed to be in contact with the channel formation region, and the impurity region has a concentration distribution in which as a distance from the channel formation region becomes larger, an impurity concentration is increased.

Further, in the above structure, an impurity element imparting one conductivity type to a semiconductor is phosphorus (P) or arsenic (As), and an n-channel type TFT is obtained. Since this n-channel type TFT has a small off current, it is suitable as a TFT of a pixel portion.

Further, in the above structure, the semiconductor device is characterized in that the impurity region has the concentration distribution in which as the distance from the channel formation region becomes larger, the impurity concentration is continuously increased, and that the impurity region includes at least a region having a concentration gradient of the concentration distribution in a channel length direction.

In the above structures, a semiconductor device includes a first insulating film on the channel formation region, and a second insulating film formed so as to contact with the first insulating film, characterized in that the first insulating film includes a taper portion.

In the above structures, a semiconductor device is characterized in that the taper portion of the first insulating film overlaps with the region having the concentration gradient in the impurity region.

In the above structure, a semiconductor device is characterized in that the second insulating film overlaps with the channel formation region.

In the above structures, a semiconductor device may adopt a structure in which the impurity region overlaps with the gate electrode, and that in which the impurity region does not overlap with the gate electrode.

Further, in the above structure, materials having different etching rates may be suitably selected for the first insulating film and the second insulating film, and for example, the first insulating film may be made a silicon nitride film, and the second insulating film may be made a silicon oxide film.

Further, in the above structures, a semiconductor device is characterized in that the impurity concentration is a concentration of an impurity element imparting one conductivity type to a semiconductor.

Further, in FIG. 1A, in the impurity region, as the distance from the channel formation region becomes larger, the impurity concentration is increased, and the concentration distribution is indicated as a normal distribution. However, the invention is not particularly limited thereto, and the concentration distribution may be an exponential distribution, may be a straight line having a slant, or may be a combination of those.

Conventionally, doping of the impurity element is carried out by using a patterned resist mask, or doping of the impurity element is carried out by using a wiring line as a mask in a self-aligning manner, so that a step-like concentration distribution as shown in FIG. 13 is formed, and the structure of the present invention, that is, the impurity region having the concentration gradient can not be obtained. Further, the present invention is also characterized by a manufacturing method for obtaining the above structure.

In order to achieve the above structure, the structure of the present invention relates to a method of manufacturing a semiconductor device, including the steps of:

forming a gate electrode on an insulating surface;

forming a gate insulating film on the gate electrode;

forming a semiconductor layer on the gate insulating film;

forming an insulating film on the semiconductor layer;

forming an insulating layer having a taper portion on the semiconductor layer by etching the insulating film; and forming an impurity region in which an impurity concentration is increased toward an end portion of the taper portion, by adding an impurity element imparting one conductivity type to the semiconductor layer through the taper portion.

Conventionally, doping of the impurity element is carried out by using the resist mask formed by using a photomask, and an LDD region, a source region and a drain region are formed. The structure of the above manufacturing method is characterized in that doping is carried out through the taper portion of the insulating layer, and the impurity region having a concentration gradient is formed.

Further, in the above structures, the method of manufacturing a semiconductor device is characterized in that the impurity element imparting one conductivity type is added to the semiconductor layer through the taper portion, and the impurity region where the impurity concentration is increased toward the end portion of the taper portion has at least the concentration gradient within the range of the impurity concentration (P concentration) of $1\times10^{17}/cm^3$ to $1\times10^{18}/cm^3$. Note that, in the present invention, as shown in FIG. 1A, it is most desirable that such concentration gradient as to completely eliminate a boundary due to the concentration difference of the impurity element in the semiconductor layer is formed in the impurity region 102 (range of $1\times10^{15}/cm^3$ to $1\times10^{21}/cm^3$). However, the effect of the present invention can also be obtained by lessening the concentration difference between the channel formation region 101 and the impurity region 102a in the vicinity of the channel formation region. Further, the effect of the present invention can also be obtained by lessening the concentration difference at the boundary between the impurity region 102b and the impurity region 102a in the vicinity of the above impurity region.

Further, a driving circuit and a pixel portion can also be formed on the same substrate.

In order to achieve the above structure, another structure of the present invention relates to a method of manufacturing a semiconductor device, including the steps of:

forming a gate electrode on an insulating surface;

forming a gate insulating film on the gate electrode;

forming a semiconductor layer on the gate insulating film;

forming a first insulating film on the semiconductor layer;

forming a second insulating film on the first insulating film;

forming a resist mask on the second insulating film;

forming a second insulating layer covering a portion which becomes a channel formation region by selectively etching the second insulating film, and forming a first insulating layer having a taper portion on the semiconductor layer by selectively etching the first insulating film;

adding an impurity element imparting one conductivity type to the semiconductor layer while the resist mask is used as a mask; and forming an impurity region in which an impurity concentration is increased toward an end portion of the taper portion, by adding an impurity element imparting one conductivity type to the semiconductor layer through the taper portion after the resist mask is removed.

The structure of the manufacturing method is characterized in that at the step of forming the resist mask, the resist mask is formed by exposure from a back side of a substrate while the gate electrode is used as a mask.

Further, the structure of the manufacturing method is characterized in that the etching at the step of forming the second insulating layer having the taper portion is a wet etching of a spin system, a dip system or the like.

Further, in the etching at the step of forming the second insulating layer having the taper portion, although it is desirable to form the layer by one etching step since the number of steps can be reduced, it may be formed by plural etching steps. Further, the second insulating layer may be formed by a dry etching. Further, the second insulating layer may be formed by a combination of the wet etching and the dry etching.

BRIEF DESCRIPTION OF THE DRAWINGS

In the accompanying drawings:

FIGS. 3A and 3B are a top view of a pixel and a sectional view thereof, respectively;

FIG. 4 is a view showing an outer appearance of a liquid crystal module;

FIGS. 5A and 5B are respectively a top view and a sectional view showing an EL module;

FIGS. 12A to 12C are views showing examples of electronic instruments; and

FIG. 13 is a view showing a conventional example.

DETAILED DESCRIPTION OF THE PREFERRED EMBODIMENTS

Figure 1A:
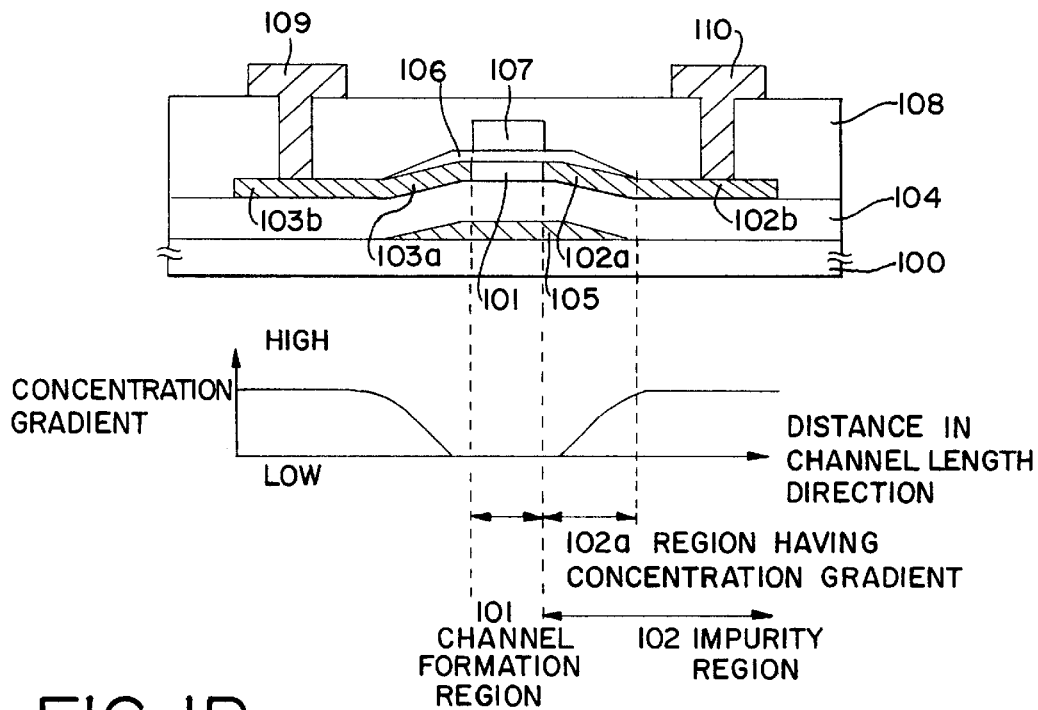
FIGS. 1A and 1B are views showing a structure of the present invention (embodiment 1)

Embodiments of the present invention will be hereinafter described with reference to FIGS. 1A and 1B.

Here, a description will be given of an example in which a taper portion of a first insulating film 106 is used to form an impurity region 102 in which an impurity concentration (P concentration) is continuously increased from a side of a channel formation region to a side of the impurity region.

First, a gate wiring line (including a gate electrode 105), an insulating film covering the gate wiring line, a semiconductor film made of a crystalline semiconductor film, a first insulating film made of a silicon nitride film, and a second insulating film made of a silicon oxide film are formed on a transparent substrate by using a first mask.

Next, a resist mask is formed by an exposure from the back side of the substrate by using the gate wiring line as a mask. Here, although a back surface exposure technique is used in order to reduce the number of steps, a normal photolithography technique may be used. In the case where the normal photolithography technique is used, the substrate is not limited to the transparent substrate, but a metal substrate or a substrate obtained by forming an insulating film on a surface of a semiconductor substrate made of silicon, germanium, gallium arsenic or the like may be used.

Next, an etching is carried out by using the resist mask, and an insulating layer having a taper portion is formed. Here, a wet etching of a dip system is carried out, and trade name "LAL500" (mixture solution containing ammonium hydrogen fluoride (NH$_4$HF$_2$) of 7.13% and ammonium fluoride (NH$_4$F) of 15.4%) is used. By this etching, a second insulating layer 107 having a pattern narrower than the resist mask is formed, and the first insulating layer 106 having the taper portion extending like a foot of mountain is also formed at the same time.

Next, a doping step for adding an impurity element imparting an n type to the semiconductor film is carried out in a state where the resist mask remains as it is, and an impurity region (n+ region) is formed. As the impurity element imparting the n type to the semiconductor material, an impurity element belonging to group 15, for example, P, As, Sb, N, Bi or the like can be used.

Next, the resist mask is removed, and a second doping step for adding an impurity element imparting the n type is carried out by using the second insulating layer as a mask. In the second doping step, the impurity element is added to the semiconductor layer through the taper portion of the first insulating layer 106, and a substantially intrinsic crystalline semiconductor region (hereinafter referred to as a channel formation region 101) remains just under the second insulating layer. Note that, in the present specification, a "substantially intrinsic" region indicates a region which does not contain an impurity element to such a degree that the Fermi level of silicon can be changed, that is, a region containing an impurity element imparting an N type or a P type within a concentration range in which threshold control is enabled, or a region where a conductivity type is cancelled by intentionally adding an opposite conductivity type impurity.

At the second doping step, by being passed through the taper portion of the first insulating layer, there are formed impurity regions 102*a* and 103*a* each having a concentration distribution in which as a distance (in a channel length direction) from the channel formation region becomes larger, an impurity concentration is increased. Note that, practically there are no definite boundaries between the channel formation region 101 and the impurity regions 102*a* and 103*a*.

Thereafter, activation of the impurity element added to the semiconductor film is carried out. By this activation, since the impurity element contained in the impurity region is diffused, the concentration gradient forming a smoother curve is formed and the boundaries between the respective regions disappear. Next, the semiconductor film is patterned into a desired shape by using a second mask to form a semiconductor layer. Next, after an interlayer insulating film 108 covering the semiconductor layer is formed, contact holes are formed by using a third mask, and electrodes 109 and 110 are formed by using a fourth mask.

Figure 1B:
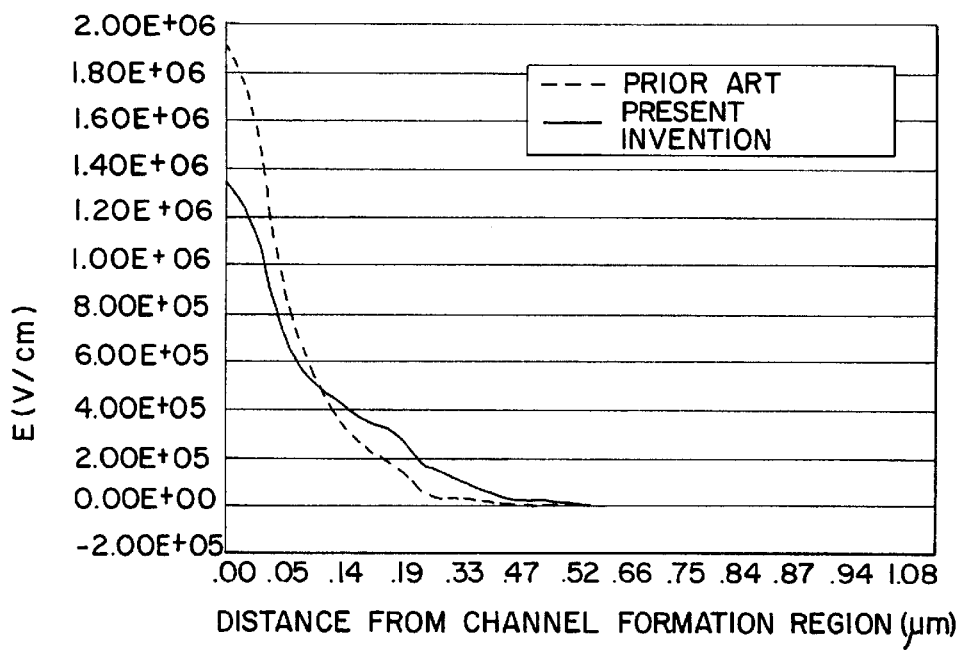

In this way, a bottom gate type TFT having a structure shown in FIG. 1A can be formed by the four photomasks.

The present invention has only to have the concentration gradient in the impurity region as shown in FIG. 1, and it is needless to say that the present invention is not limited to the channel stop type bottom gate TFT structure shown in FIG. 1A. For example, the present invention can also be applied to a channel etch type bottom gate TFT structure.

Figure 7:
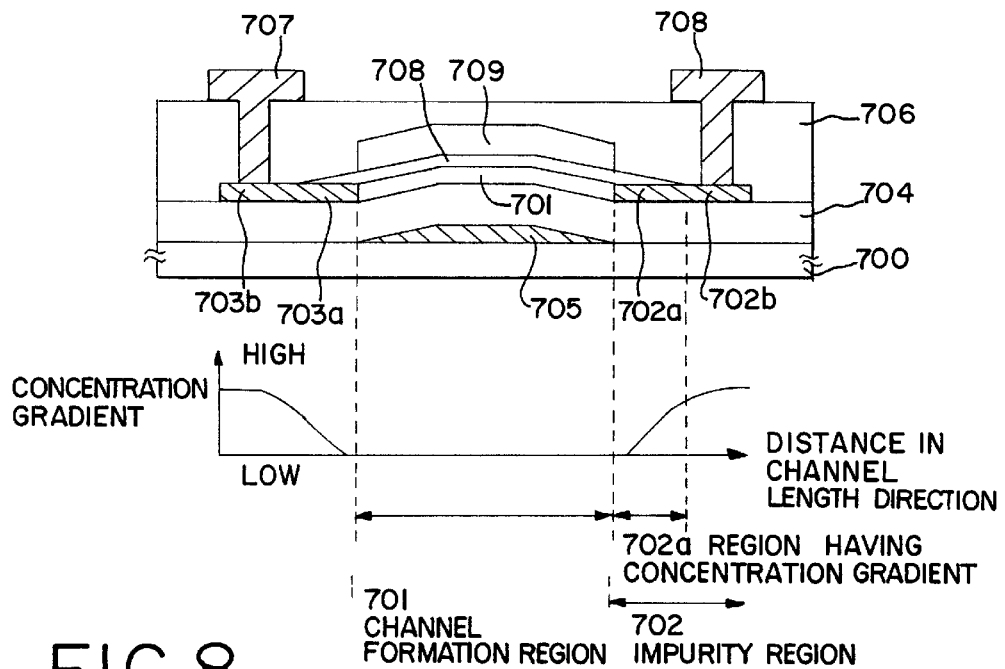
FIG. 7 is a view showing a structure of the present invention (embodiment 4)

Although FIG. 1 shows the structure in which the gate electrode 105 overlaps with the impurity regions 102 and 103, as shown in FIG. 7, a structure may be adopted in which the gate electrode does not overlap with the impurity region.

Further, here, although the example in which the impurity region having the concentration gradient is formed by using the insulating layer having the taper portion, has been described, a metal layer may be used. In that case, an insulating film is formed on a semiconductor film, and a taper portion has only to be formed thereon by an ICP etching method by using a metal layer, for example, a laminate structure using TaN as a first metal layer and W as a second metal layer. Further, it is desirable to remove the metal layer after a doping treatment using the metal layer having the taper portion.

The present invention having the above structure will be described in more detail by use of embodiments described below.

Embodiment 1

Here, a method of manufacturing a TFT (n-channel type TFT) on a substrate will be described with reference to FIGS. 2A to 2F.

First, in this embodiment, a substrate 200 made of glass, such as barium borosilicate glass or aluminoborosilicate glass, typified by #7059 glass or #1737 glass produced by Corning is used. The substrate 200 is not limited thereto as long as it is transparent, and a quartz substrate or a plastic substrate having such heat resistance that it can withstand processing temperature may be used.

Next, an underlying insulating film (not shown) is formed on the substrate 200. As the underlying insulating film, the underlying film made of an insulating film such as a silicon oxide film, a silicon nitride film, or a silicon nitride oxide film is formed. If there is no problem in pollution from the substrate to a semiconductor layer, the underlying insulating film may not be formed.

Next, a gate wiring line (including a gate electrode 201) having a single layer structure or a laminate structure is formed on the underlying insulating film. A thermal CVD method, a plasma CVD method, a reduced pressure thermal CVD method, an evaporation method, a sputtering method, or the like is used as a forming means of the gate wiring line, and after a conductive film having a film thickness of 10 to 1000 nm, preferably 30 to 300 nm is formed, the gate wiring line is formed by a well-known patterning technique (first mask). Any material can be used for the gate wiring line without specific limitation as long as the structure thereof includes at least one layer of a conductive material or a material containing a semiconductor material as its main ingredient, for example, a high melting point metal material such as Ta (tantalum), Mo (molybdenum), Ti (titanium), W (tungsten) or Cr (chromium), silicide as a compound of the metal material and silicon, a material such as polysilicon having N type or P type conductivity, or a material containing a low resistance metal material, such as Cu (copper) or Al (aluminum), as its main ingredient. Note that, a laminate structure in which a lower layer of the gate wiring line is made of the low resistance metal material and an upper layer thereof is made of the high melting point metal material is desirable. For example, the laminate structure of Al (lower layer) and Ta (upper layer), the laminate structure of Al (lower layer) and W (upper layer), or the laminate structure of Al (lower layer) and Cu (upper layer) is desirable. Further, a structure may be adopted in which an anodic oxidation film or an oxidation film for protecting the gate wiring line is formed.

Next, a gate insulating film 202 covering the gate wiring line is formed. As the gate insulating film, a silicon oxide film, a silicon nitride film, a silicon nitride oxide film (SiOxNy), an organic resin film (BCB (benzocyclobutene) film), a laminate film of these, or the like, can be used within the thickness range of 100 to 400 nm. A forming method such as a thermal CVD method, a plasma CVD method, a reduced pressure thermal CVD method, an evaporation method, a sputtering method, or a coating method can be used as a forming means of the gate insulating film.

Figure 2A:
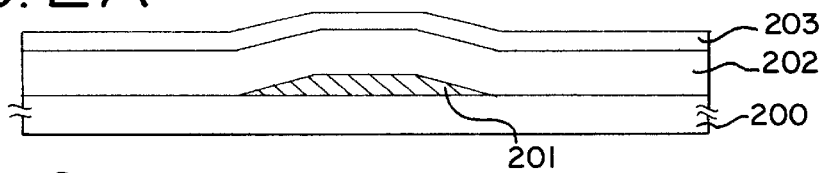
FIGS. 2A to 2F are views showing a manufacturing process of the present invention (embodiment 1)

Next, an amorphous semiconductor film 203 is formed (FIG. 2A). As the amorphous semiconductor film 203, an amorphous silicon film or an amorphous silicon germanium film containing silicon as its main ingredient can be used in the thickness range of 20 to 100 nm, more preferably, 20 to 60 nm. A forming method such as a thermal CVD method, a plasma CVD method, a reduced pressure CVD method, an evaporation method, or a sputtering method can be used as a forming means of the amorphous semiconductor film.

Note that, if the gate insulating film 202 and the amorphous semiconductor film 203 are continuously formed without being exposed to the air, an impurity is not mixed in the interface between the gate insulating film and the amorphous semiconductor film, and excellent interface characteristics can be obtained.

Next, the amorphous semiconductor film 203 is subjected to a well-known crystallization treatment (a laser crystallization method, a thermal crystallization method, a thermal crystallization method using a catalyst such as nickel, etc.) and thus a crystalline semiconductor film is obtained.

Next, a first insulating film 204a and a second insulating film 205a are formed on the crystalline semiconductor film. A silicon oxide film, a silicon nitride film, a silicon nitride oxide film (SiOxNy), an organic resin film (BCB film), a laminate film of these, or the like may be used as the first insulating film and the second insulating film. However, in the first insulating film, a material whose etching rate in a subsequent etching treatment is different from that of the second insulating film is used. Further, in order to carry out doping (second doping) to the semiconductor film through the first insulating film in a subsequent step, it is used within the range of 10 to 100 nm. The second insulating film is used within the thickness range of 100 to 400 nm in order to form the second insulating layer having such a thickness as to prevent doping to the channel formation region in the subsequent doping (second doping). In this embodiment, the first insulating film 204a having a thickness of 25 nm and made of a silicon nitride film and the second insulating film 205a having a thickness of 100 nm and made of a silicon oxide film were formed by using a PCVD method.

Figure 2B:
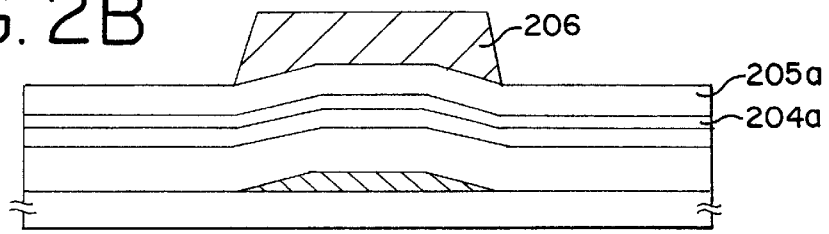

Next, a resist mask 206 made of resist is formed by using a back surface exposure technique and by using the gate electrode 201 as a mask (FIG. 2B).

Figure 2C:
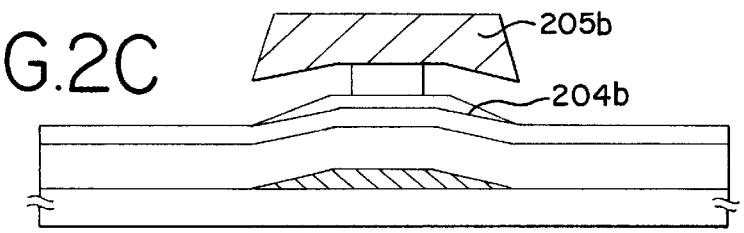

Next, an etching treatment is carried out to form an insulating layer having a taper portion. In this embodiment, LAL500 (20° C.) is used as an etchant to carry out the etching treatment for 35 seconds, and the first insulating film and the second insulating film are selectively removed at the same time. Note that, the etching rate of the silicon nitride film is lower than that of the silicon oxide film. By this etching treatment, a first insulating layer 204b and a second insulating layer 205b as shown in FIG. 2C are formed. The first insulating layer 204b formed by the etching treatment and having the taper portion extending like the foot of mountain serves to form a gradient in a concentration distribution of an impurity region formed at the subsequent doping (second doping).

Figure 2D:
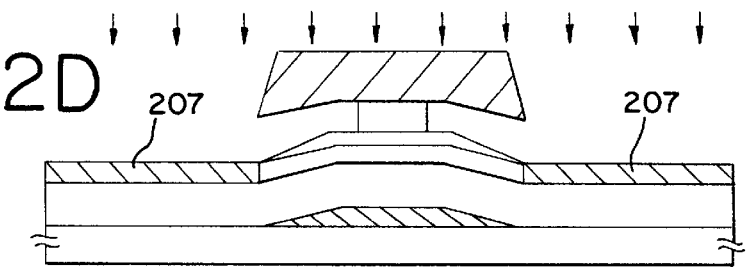

Next, the resist mask 206 is used as a mask as it is, and a first doping is carried out. This doping treatment may be carried out by an ion doping method or an ion injection method. By this first doping, an impurity region 207 is formed in the crystalline semiconductor film (FIG. 2D). An impurity element imparting the n type within the concentration range of $1 \times 10^{20}$ to $1 \times 10^{21}/cm^3$ is added to the impurity region 207.

Figure 2E:
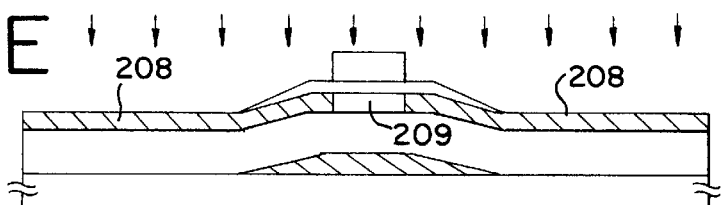

Next, after the resist mask 206 is removed, the second doping is carried out. By this second doping, an impurity region 208 having a gradient in a concentration distribution is formed (FIG. 2E). A region which is not doped becomes a channel formation region 209. The impurity region 208 includes a region where as the distance from the channel formation region becomes larger in a channel length direction, the impurity concentration is increased. The impurity concentration in the impurity region 208 reflects the film thickness of the taper portion of the first insulating layer 204b at the second doping. That is, as the distance from the channel formation region becomes larger, the thickness of the taper portion becomes continuously thinner, and as the distance from the channel formation region becomes larger, the concentration distribution ($1 \times 10^{15}$ to $1 \times 10^{21}/cm^3$) of the impurity element which is added through the taper portion is continuously increased.

Thereafter, activation of the impurity element added to the semiconductor film is carried out. This activation step is carried out by a thermal annealing method using an annealing furnace oven. In addition to the thermal annealing method, a laser annealing method or a rapid thermal annealing method (RTA method) can be applied thereto. Since the impurity element contained in the impurity region is diffused by this activation, the concentration gradient forming a smoother curve is formed and boundaries between the respective regions disappear. Further, in the case where a metal element for facilitating crystal growth is used as the crystallization method of the semiconductor film, it is desirable to carry out gettering by a well-known method.

Next, after hydrogenation is carried out, the semiconductor film is patterned into a desired shape by using a second mask to form a semiconductor layer. Next, after an interlayer insulating film 212 covering the semiconductor layer is formed, contact holes reaching impurity regions 210 and 211 are formed by using a third mask, and electrodes 213 and 214 are formed by using a fourth mask. As the interlayer insulating film 212, a plasma CVD method or a sputtering method is used to form an insulating film having a thickness of 10 to 200 nm and containing silicon. Further, as materials for the electrodes 213 and 214, a film containing Al or Ti as its main ingredient, a laminate film of those or the like is used.

Figure 2F:
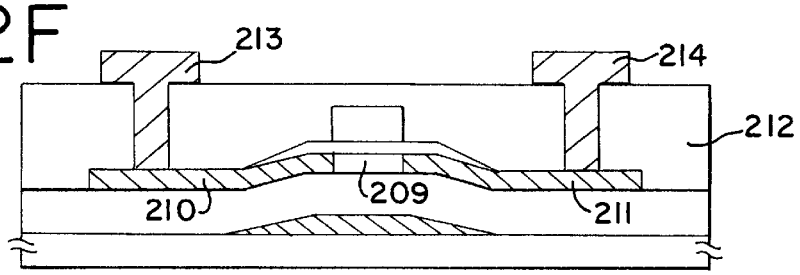

In this way, it was possible to form the bottom gate type TFT of the structure shown in FIG. 2F by the four photomasks. The TFT characteristics obtained in this embodiment are excellent, especially the off current value is lowered, and the ratio of the on current value to the off current value can be made high.

Although this embodiment adopts the structure in which the first insulating layer 204b and the second insulating layer 205b remain, they may be removed.

Further, although the description has been given while the n-channel type TFT is used as an example, instead thereof, a circuit using, as a unit, a CMOS structure in which an n-channel type TFT and a p-channel type TFT is combined with each other can be also formed on the same substrate. In this case, at least one photomask is required to selectively dope an impurity element imparting the n type and an impurity element imparting the p type for each TFT.

Embodiment 2

In this embodiment, the description will be given of an example in which a TFT obtained in the embodiment 1 is used to fabricate an active matrix type substrate and to further fabricate a liquid crystal module.

An n-channel type TFT is used as a pixel TFT in a pixel portion, an n-channel type TFT and a p-channel type TFT are used in a driving circuit portion, and they are formed on the same substrate in accordance with the Embodiment 1.

FIG. 3A is an enlarged top view showing one pixel. FIG. 3B is a sectional view taken along a dotted line A–A' of FIG. 3A.

In the pixel portion, a gate electrode 302 is formed on a substrate 301, and a first insulating film 303a made of a silicon nitride film and a second insulating film 303b made of a silicon oxide film are provided thereon. As an active layer, impurity regions 304 to 306 not covered with a first insulating layer 300, channel formation regions 307 and 308, and impurity regions 309 and 310 between the impurity region and the channel formation region and covered with the first insulating layer 300 are formed on the second insulating film. Each of the impurity regions 309 and 310 covered with the first insulating layer 300 has a gradient in a concentration distribution, and as a distance from the channel formation region becomes larger, an impurity concentration is increased. The channel formation regions 307 and 308 are protected by second insulating layers 311 and 312. After contact holes are formed in the second insulating layers 311 and 312 and a first interlayer insulating film 313 covering the active layer, a wiring line 314 connected to the n+ region 304 is formed, a wiring line 315 is connected to the impurity region 306, and a passivation film 316 is further formed thereon. Then, a second interlayer insulating film 317 is formed thereon. Further, a third interlayer insulating film 318 is formed thereon, and a pixel electrode 319 made of a transparent conductive film made of ITO, $SnO_2$ or the like is connected to the wiring line 315. Reference numeral 320 designates a pixel electrode adjacent to the pixel electrode 319. In the present specification, a substrate at a stage where a pixel electrode is formed is called an active matrix substrate.

Although a transmission type is shown as an example in this embodiment, the present invention is not particularly limited thereto. For example, when a metal material having reflectivity is used as a material for a pixel electrode, and a change of patterning of the pixel electrode or addition/deletion of some steps is suitably carried out, a reflection type liquid crystal module can be fabricated.

Note that, in this embodiment, although the gate wiring lines of the pixel TFT of the pixel portion are made to have a double gate structure, a multi-gate structure such as a triple gate structure may be adopted in order to reduce fluctuation of an off current. Further, a single gate structure may be adopted in order to improve an aperture ratio.

A capacitance portion of the pixel portion is formed of a capacitance wiring line 321 and the impurity region 306, while the first insulating film and the second insulating film are used as dielectric.

Note that, the pixel portion shown in FIGS. 3A and 3B is merely one example, and it is needless to say that the present invention is not particularly limited to the above structure.

In a top view shown in FIG. 4, an active matrix substrate in which a pixel portion, a driving circuit, an external input terminal to which an FPC (flexible printed circuit) is affixed, a wiring line 410 for connecting the external input terminal to input portions of respective circuits, and the like are formed, is bonded through a sealing material to a counter substrate 400 on which color filters and the like are provided.

A light shielding layer 403a is provided at the counter substrate side so as to overlap with a gate wiring line side driving circuit 401a, and a light shielding layer 403b is formed at the counter substrate side so as to overlap with a source wiring line side driving circuit 401b. In a color filter 402 provided at the counter substrate side on a pixel portion 412, a light shielding layer and a colored layer of each color of red (R), green (G) and blue (B) are provided corresponding to each pixel. When a display is actually carried out, although a color display is performed using three colors of a red (R) colored layer, a green (G) colored layer, and a blue (B) colored layer, the arrangement of the colored layers of the respective colors is arbitrary.

Here, although the color filter 402 is provided at the counter substrate to realize colorization, the invention is not particularly limited thereto, and when the active matrix substrate is fabricated, the color filter may be formed at the active matrix substrate.

Further, in the color filter, the light shielding layer is provided between adjacent pixels, and shades a place other than a display region. Here, although the light shielding layers 403a and 403b are provided also in the regions covering the driving circuits, since the regions covering the driving circuits are covered with a cover when a liquid crystal display device is later installed as a display portion of an electronic equipment, a structure may be adopted in which the light shielding layer is not particularly provided. Further, when the active matrix substrate is fabricated, the light shielding layer may be formed on the active matrix substrate.

Further, instead of providing the above light shielding layers, a laminate layer in which a plurality of colored layers constituting the color filter are stacked is suitably arranged to shade the light between the counter substrate and the counter electrode, and a place (gap between respective pixel electrodes) other than the display region, or the driving circuit may be light-shielded.

An FPC411 made of a base film and a wiring line is affixed to the external input terminal through an anisotropic conductive resin. Further, mechanical strength is raised by a reinforcing plate.

A liquid crystal module fabricated in the manner described above can be used as a display portion of various electronic instruments.

Embodiment 3

In this embodiment, an example in which a self-luminous display device including an EL (electro luminescence) element (a light emitting device or a light emitting diode or OLED (Organic Light Emission Diode)) is fabricated will be described with reference to FIGS. 5A and 5B. The EL (electroluminescent) devices referred to in this specification include triplet-based light emission devices and/or singlet-based light emission devices, for example.

FIG. 5A is a top view showing an EL module, and FIG. 5B is a sectional view taken along a line A–A' of FIG. 5A.

A pixel portion 502, a source side driving circuit 501, and a gate side driving circuit 503 are formed on a substrate 500 (for example, a glass substrate, a crystallized glass substrate, a plastic substrate, or the like) having an insulating surface. Reference numeral 518 designates a sealing material, and a portion 519 surrounded by a dotted line is a DLC film. The pixel portion and the driving circuit portion are covered with the sealing material 518, and the sealing material is covered with the protection film 519. Further, it is sealed with a cover member by using an adhesive.

Note that, reference numeral 508 designates a wiring line for transmitting signals inputted into the source side driving circuit 501 and the gate side driving circuit 503, which receives video signals and clock signals from an FPC (flexible printed circuit) 509 as an external input terminal. Although only the FPC is shown here, a printed wiring board (PWB) may be attached to the FPC. The self-luminous device in the present specification includes not only the self-luminous device itself but also a state where the FPC or the PWB is attached thereto.

Next, a sectional structure will be described with reference to FIG. 5B. An insulating film 510 is provided on a substrate 500, the pixel portion 502 and the gate side driving circuit 503 are formed over the insulating film 510, and the pixel portion 502 is formed of a plurality of pixels each including a current controlling TFT 511 and a pixel electrode 512 electrically connected to its drain. The gate side driving circuit 503 is formed by using a CMOS circuit in which an n-channel type TFT 513 and a p-channel type TFT 514 are combined.

These TFTs (including TFTs 511, 513 and 514) may be fabricated in accordance with the embodiment 1.

The pixel electrode 512 serves as an anode of the EL element. A bank 515 is formed at both ends of the pixel electrode 512, and an EL layer 516 and a cathode 517 of the EL element are formed on the pixel electrode 512.

As the EL layer 516, a light emitting layer, a charge transportation layer and a charge injection layer may be freely combined to form the EL layer (layer for light emission and for causing movement of carriers to that end). For example, a low molecular organic EL material or a high molecular organic EL material may be used. Further, a thin film made of a light emitting material (singlet compound) emitting light (fluorescence) by singlet excitation, or a thin film made of a light emitting material (triplet compound) emitting light (phosphorescence) by triplet excitation can be used as the EL layer. Particularly, the triplet compound emitting light by the triplet excitation is preferable since sufficient brightness can be obtained by merely applying a voltage of about 5 V. Further, an inorganic material such as silicon carbide can also be used for the charge transportation layer or the charge injection layer. As the organic EL material or the inorganic material, a well-known material can be used.

The cathode 517 serves also as a wiring line common to all pixels, and is electrically connected to the FPC 509 through the connection wiring line 508. Further, all elements included in the pixel portion 502 and the gate side driving circuit 503 are covered with the cathode 517, the sealing material 518, and the protection film 519.

Note that, as the sealing material 518, it is preferable to use the most transparent or semitransparent possible material to visible light. Further, it is desirable that the sealing material 518 is a material which resists the permeation of moisture or oxygen to the utmost.

Further, it is preferable that after the light emitting element is completely covered by using the sealing material 518, as shown in FIG. 5B, at least the protection film 519 made of a DLC film or the like is provided on the surface (exposed surface) of the sealing material 518. Further, the protection film may be provided on all surfaces including the back surface of the substrate. Here, it is necessary to give attention so that the protection film is not formed at the portion where the external input terminal (FPC) is provided. A mask may be used so that the protection film is not formed, or a tape of Teflon or the like used as a masking tape in a CVD apparatus may cover the portion of the external input terminal so that the protection film is not formed.

The EL element is sealed with the sealing material 518 and the protection film in the structure described above, so that the EL element can be completely sealed from the outside, and it is possible to prevent intrusion of a material to facilitate deterioration by oxidation of the EL layer, such as moisture and oxygen, from the outside. Accordingly, the self-luminous device having high reliability can be obtained.

Embodiment 4

The embodiment 1 shows the example in which the impurity region overlaps with the gate electrode. In this embodiment, an example in which the impurity region does not overlap with the gate electrode will be described with reference to FIGS. 6A to 6F and FIG. 7.

Figure 6A:
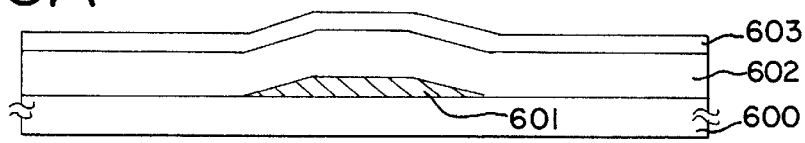
FIGS. 6A to 6F are views showing a manufacturing process of the present invention (embodiment 4)

First, similarly to the embodiment 1, a gate wiring line (including a gate electrode 601) is formed on a substrate 600, and a gate insulating film 602 covering the gate electrode, and a semiconductor film 603 are formed (FIG. 6A).

Next, a first insulating film 604a and a second insulating film 605a are formed to make a laminate.

Figure 6B:
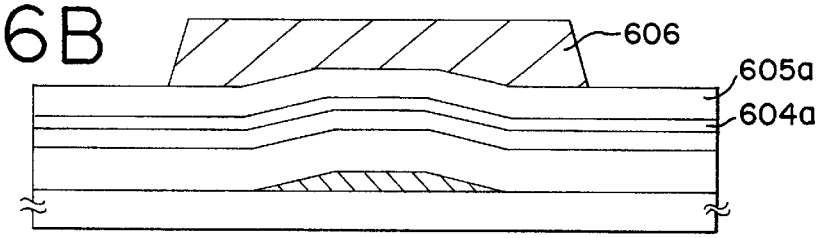

Next, a resist mask 606 is formed by using a photolithography technique (FIG. 6B). This resist mask has a width wider than the width of the gate electrode. Note that, here, although the resist mask is formed by using a photomask, the resist mask 606 may be formed by a back surface exposure technique.

Figure 6C:
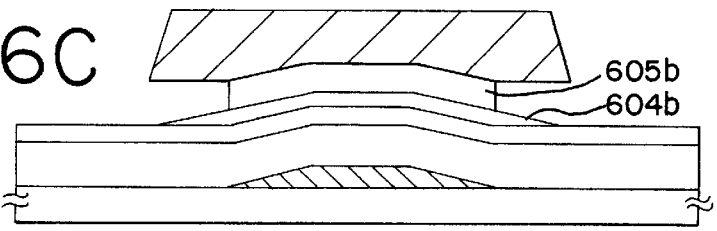

Next, an etching treatment is carried out to form an insulating layer having a taper portion. In this embodiment, LAL500 (20° C.) was used as an etchant and an etching treatment for 35 seconds was carried out, so that the first insulating film and the second insulating film were selectively removed at the same time. By this etching, a first insulating layer 604b and a second insulating layer 605b are formed (FIG. 6C).

Figure 6D:
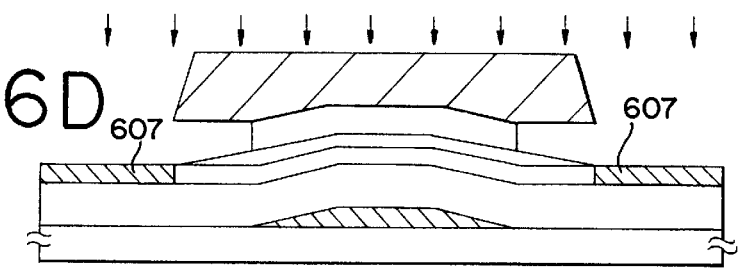

Next, the resist mask 606 is used as a mask as it is, and first doping is carried out. The doping treatment may be carried out by an ion doping method or an ion injection method. An impurity region 607 is formed in a crystalline semiconductor film by this first doping (FIG. 6D). An impurity element imparting the n type is added to the impurity region within the concentration range of $1 \times 10^{20}$ to $1 \times 10^{21}/cm^3$.

Figure 6E:
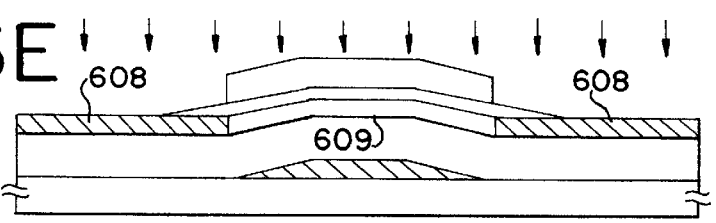

Next, after the resist mask 606 is removed, second doping is carried out. By this second doping, an impurity region 608 is formed (FIG. 6E). A region which is not doped becomes a channel formation region 609. The impurity region 608 includes a region where as a distance from the channel formation region in a channel length direction becomes larger, an impurity concentration is increased. The impurity concentration in the impurity region 608 reflects the film thickness of the taper portion of the first insulating layer 604b at the second doping. That is, as the distance from the channel formation region becomes larger, the thickness of the taper portion continuously becomes thinner, and as the distance from the channel formation region becomes larger, the concentration distribution ($1 \times 10^{15}$ to $1 \times 10^{21}/cm^3$) of the impurity element added through this taper portion is continuously increased.

Thereafter, activation of the impurity element added to the semiconductor film is carried out. This activation step is carried out by a thermal annealing method using an annealing furnace. Note that, in addition to the thermal annealing method, a laser annealing method or a rapid thermal annealing method (RTA method) can be applied. By this activation, the impurity element contained in the impurity region is diffused, so that the concentration gradient drawing a smoother curve is formed and boundaries between the respective regions disappear Further, in the case where a metal element to facilitate crystal growth is used as a crystallization method of a semiconductor film, it is desirable to carry out gettering by a well-known method.

Next, after hydrogenation is carried out, a third mask is used to pattern the semiconductor film into a desired shape so that a semiconductor layer is formed. Next, after an interlayer insulating film 612 covering the semiconductor layer is formed, contact holes reaching impurity regions 610 and 611 are formed by using a fourth mask, and electrodes 613 and 614 are formed by using a fifth mask. The interlayer insulating film 612 is formed by using a plasma CVD method or a sputtering method and is made of an insulating film having a thickness of 10 to 200 nm and containing silicon. As materials of the electrodes 613 and 614, a film containing Al or Ti as its main ingredient, a laminate film of those or the like is used.

Figure 6F:
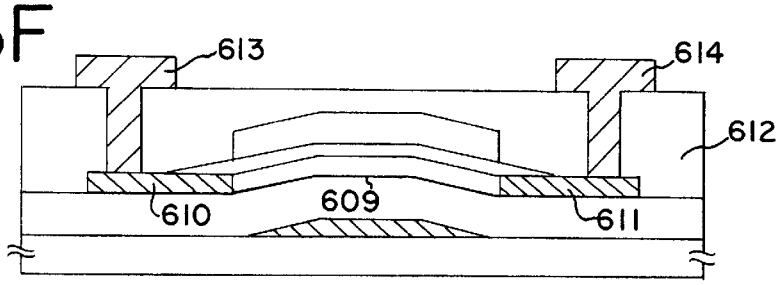

In this way, it was possible to form the bottom gate type TFT having the structure shown in FIG. 6F by five photomasks. The TFT characteristics obtained in this embodiment are excellent, particularly the off current value is reduced, and the ratio of the on current value to the off current value can be made high.

FIG. 7 shows a concentration distribution in the impurity region of the TFT obtained in this embodiment.

An impurity region 702 is characterized in that a region 702a has such a concentration gradient that as the distance (distance in the channel direction) from the channel formation region becomes larger, the concentration of the impurity element imparting one conductivity type is increased.

That is, there is provided the impurity region characterized in that as the distance in the channel direction from the end portion of the gate electrode 705 becomes larger toward the peripheral portion (peripheral portion in the section cut in the channel length direction) of the semiconductor layer, the concentration of the impurity element (phosphorus) is gradually increased. Accordingly, in this impurity region, the electric resistance is large at the side of the channel formation region, and the electric resistance is small at the side of the peripheral portion of the semiconductor layer.

However, the structure is adopted in which although the gate electrode 705 overlaps with a channel formation region 701 through a gate insulating film 704, it does not overlap with the impurity region 702. Note that, in FIG. 7, reference numeral 700 designates a substrate having an insulating surface; 706, an interlayer insulating film; 707, a source electrode; and 708, a drain electrode.

Further, in this embodiment, although the structure is adopted in which a first insulating layer 708 and a second insulating layer 709 remain, they may be removed.

Further, this embodiment can be freely combined with any one of the embodiments 1 to 3.

Embodiment 5

Figure 8:
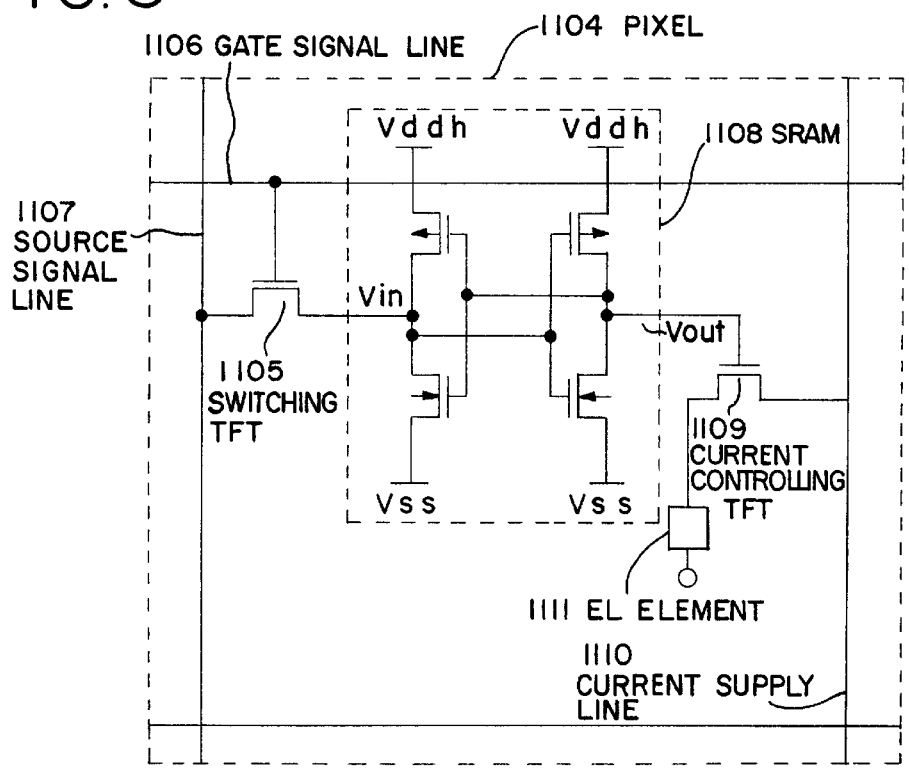
FIG. 8 is a view showing a circuit block diagram.

In this embodiment, an example in which a memory element (SRAM) is incorporated in each pixel of an EL module set forth in the embodiment 3 will be described. FIG. 8 is an enlarged view of a pixel 1104.

In FIG. 8, reference numeral 1105 designates a switching TFT. A gate electrode of the switching TFT 1105 is connected to a gate signal line 1106 as one of gate signal lines (G1 to Gn) to which gate signals are inputted. One of a source region and a drain region of the switching TFT 1105 is connected to a source signal line 1107 as one of source signal lines (S1 to Sn) to which signals are inputted, and the other is connected to an input side of an SRAM 1108. An output side of the SRAM 1108 is connected to a gate electrode of a current controlling TFT 1109.

One of a source region and a drain region of the current controlling TFT 1109 is connected to a current supply line 1110 as one of current supply lines (V1 to Vn), and the other is connected to an EL element 1111.

The EL element 1111 is made of an anode, a cathode, and an EL layer provided between the anode and the cathode. In the case where the anode is connected to the source region or the drain region of the current controlling TFT 1109, in other words, in the case where the anode is a pixel electrode, the cathode becomes a counter electrode. On the contrary, in the case where the cathode is connected to the source region or the drain region of the current controlling TFT 1109, in other words, in the case where the cathode is the pixel electrode, the anode becomes the counter electrode.

The SRAM 1108 includes two p-channel type TFTs and two n-channel type TFTs, the source region of the p-channel type TFT is connected to Vddh at a high voltage side, and the source region of the n-channel type TFT is connected to Vss at a low voltage side. One p-channel type TFT and one n-channel type TFT make a pair, and two pairs of p-channel type TFTs and n-channel type TFTs exist in one SRAM.

Note that, since the structure of the n-channel type TFT in this embodiment is almost equal to the n-channel type TFT formed in the embodiment 1, the detailed description is omitted here. The structure of the p-channel type TFT is also omitted.

The drain regions of the paired p-channel type TFT and n-channel type TFT are connected to each other, and the gate electrodes of the paired p-channel type TFT and n-channel type TFT are connected to each other. The drain regions of the p-channel type TFT and the n-channel type TFT of one of the pairs are kept to have the same potential as the gate electrodes of the p-channel type TFT and the n-channel type TFT of the other pair.

The drain regions of the p-channel type TFT and the n-channel type TFT of the one of the pairs form an input side to which an input signal (Vin) is inputted, and the drain regions of the p-channel type TFT and the n-channel type TFT of the other pair form an output side from which an output signal (Vout) is outputted.

The SRAM is designed to hold Vin and to output Vout as an inverted signal of Vin. That is, when Vin is Hi, Vout becomes a signal of Lo equivalent to Vss, and when Vin is Lo, Vout becomes a signal of Hi equivalent to Vddh.

Note that, as shown in this embodiment, in the case where one SRAM is provided in the pixel 1104, since memory data in the pixel is held, it is possible to display a still picture in the state where most of the external circuits are stopped. By this, reduction in electric power consumption can be realized.

Further, a plurality of SRAMs can be provided in a pixel, and in the case where the plurality of SRAMs are provided, since a plurality of data can be held, a gradation display by a time gradation is enabled.

Note that, the structure of this embodiment can be freely combined with any structure of the embodiment 1, 3 or 4 can be carried out.

Embodiment 6

An example of manufacturing an EL (electro-luminescence) display device using the TFTs obtained by Embodiment 1 is explained below using FIG. 9.

Figure 9:
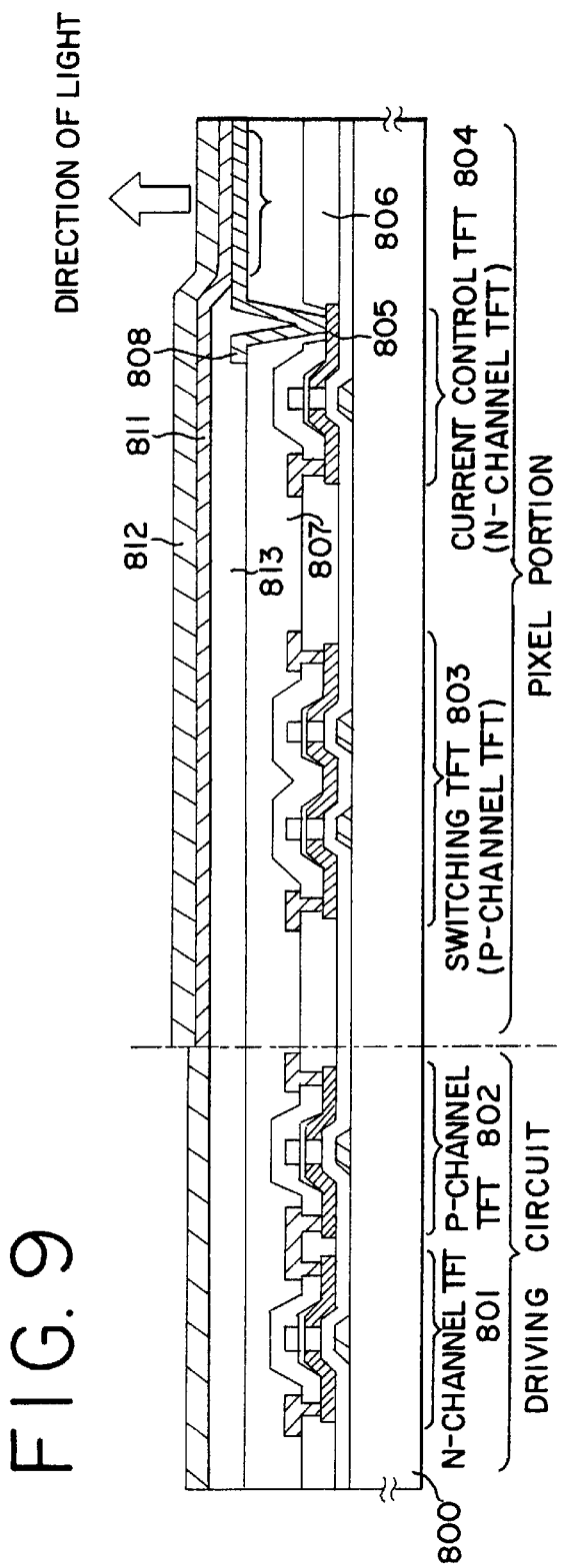
FIG. 9 is a sectional view of an EL module.

An example of a light emitting device having a pixel portion and a driving circuit for driving the pixel portion on the same insulating body (the state before the sealing) is shown in FIG. 9. Note that the basic unit of a CMOS circuit is shown in the driving circuit, and one pixel is shown in the pixel portion. This CMOS circuit can be obtained in accordance with Embodiment 1.

Reference numeral 800 denotes an insulating body in FIG. 9, and an n-channel TFT 801, a p-channel TFT 802, a switching TFT 803 composed of a p-channel TFT, and a current control TFT 804 composed of an n-channel TFT are formed on the insulating body 800. Further, all TFTs in Embodiment 6 are structured by reverse stagger TFTs.

Embodiment 1 may be referred to for an explanation of the n-channel TFT 801 and the p-channel TFT 802, and therefore such explanation is omitted here. Further, the switching TFT 803 has a structure in which two channel-forming regions are formed between a source region and a drain region (double gate structure), and this structure can be understood easily by referring to the explanation of the p-channel TFT 802 in Embodiment 1. Such explanation is therefore omitted here. Note that there are no particular limitations to the double gate structure in Embodiment 6, and a single gate structure in which one channel forming region is formed, and a triple gate structure in which three channel-forming regions are formed may also be used.

Further, a contact hole is formed in a first interlayer insulating film 806 before forming a second interlayer insulating film 807 on a drain region 805 of the current control TFT 804. This is done in order to simplify an etching process when forming a contact hole in the second interlayer insulating film 807. The first interlayer insulating film 806 and the second interlayer insulating film 807 are formed by an insulating film including silicon or a resin film, and the lamination film of the above films may used. A contact hole is formed in the second interlayer insulating film 807 so as to reach the drain region 805, and a pixel electrode 808 is formed contacting the drain region 805. The pixel electrode 808 is an electrode which functions as a cathode of an EL element, and the pixel electrode 808 is formed using a conductive film containing an element residing in periodic table group 1 or group 2. A conductive film made from a lithium and aluminum compound is used in Embodiment 6.

Reference numeral 813 denotes an insulating film formed so as to cover the end portion of the pixel electrode 808, and is referred to as a bank throughout this specification. The bank 813 may be formed by an insulating film containing silicon or from a resin film. If a resin film is used, damage to the insulating properties at the time of film deposition can be suppressed if carbon particles or metal particles are added so that the resistivity of the resin film becomes from $1\times10^6$ to $1\times10^{12}$ $\Omega$m (preferably from $1\times10^8$ to $1\times10^{10}$ $\Omega$m).

Further, an EL element 809 is composed of the pixel electrode (cathode) 808, an EL layer 811, and an anode 812. A conductive film having a high work function, typically a conductive oxide film, is used for the anode 812. Indium oxide, tin oxide, zinc oxide, or a compound of these materials may be used as the conductive oxide film.

Note that, throughout this specification, a lamination body in which a hole injecting layer, a hole transporting layer, a hole stopping layer, an electron transporting layer, an electron injecting layer, or an electron stopping layer are combined with respect to a light emitting layer is defined as an EL layer.

Note that, although not shown in the figures, it is effective to form a passivation film so as to completely cover the EL element 809 after forming the anode 812. An insulating film made from a carbon film, a silicon nitride film, or an insulating film including a silicon oxynitride film may be used as the passivation film in either a single layer structure or a lamination structure of a combination of the above insulating films.

This embodiment can be freely combined with an embodiment among Embodiments 1, 3, 4 and 5.

Embodiment 7

The driving circuit portion and the pixel portion fabricated by implementing the present invention can be utilized for various modules (active matrix liquid crystal module, active matrix EL module and active matrix EC module). Namely, the present invention can be implemented onto all of the electronic devices that incorporate such electronic devices as a display portion.

Following can be given as such electronic devices: video cameras; digital cameras; head mounted displays (goggle type displays); car navigation systems; projectors; car stereo; personal computers; portable information terminals (mobile computers, portable telephones or electronic books etc.) etc. Examples of these are shown in FIGS. 10A to 12C.

Figure 10A:
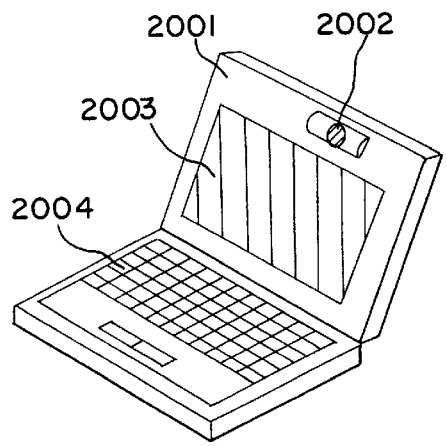
FIGS. 10A to 10F are views showing examples of electronic instruments.

FIG. 10A is a personal computer which comprises: a main body 2001; an image input section 2002; a display section 2003; and a key board 2004. The present invention can be applied to the display section 2003.

Figure 10B:
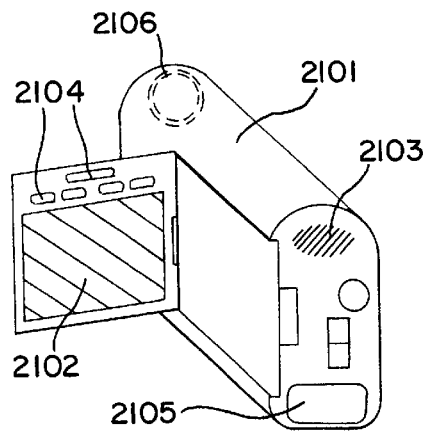

FIG. 10B is a video camera which comprises: a main body 2101; a display section 2102; a voice input section 2103; operation switches 2104; a battery 2105 and an image receiving section 2106. The present invention can be applied to the display section 2102.

Figure 10C:
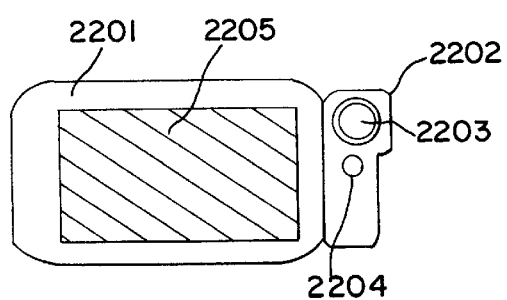

FIG. 10C is a mobile computer which comprises: a main body 2201; a camera section 2202; an image receiving section 2203; operation switches 2204 and a display section 2205. The present invention can be applied to the display section 2205.

Figure 10D:
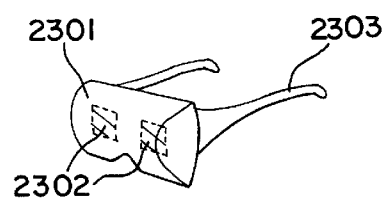

FIG. 10D is a goggle type display which comprises: a main body 2301; a display section 2302; and an arm section 2303. The present invention can be applied to the display section 2302.

Figure 10E:
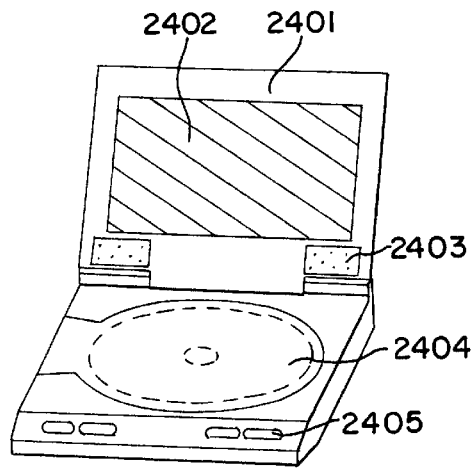

FIG. 10E is a player using a recording medium which records a program (hereinafter referred to as a recording medium) which comprises: a main body 2401; a display section 2402; a speaker section 2403; a recording medium 2404; and operation switches 2405. This device uses DVD (digital versatile disc), CD, etc. for the recording medium, and can perform music appreciation, film appreciation, games and the use for Internet. The present invention can be applied to the display section 2402.

Figure 10F:
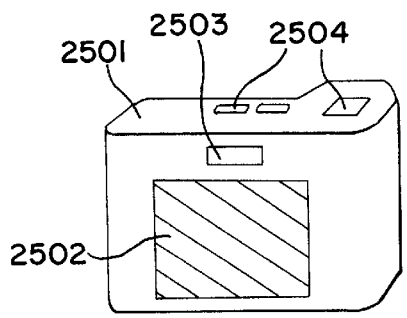

FIG. 10F is a digital camera which comprises: a main body 2501; a display portion 2502; a view finder 2503; operation switches 2504; and an image receiving section (not shown in the figure). The present invention can be applied to the display section 2502.

Figure 11A:
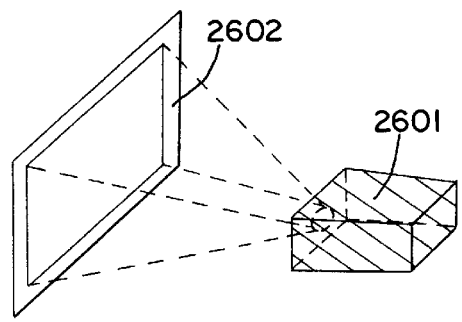
FIGS. 11A to 11D are views showing examples of electronic instruments.

FIG. 11A is a front type projector which comprises: a projection system 2601; and a screen 2602. The present invention can be applied to the liquid crystal module 2808 which forms a part of the projection system 2601.

Figure 11B:
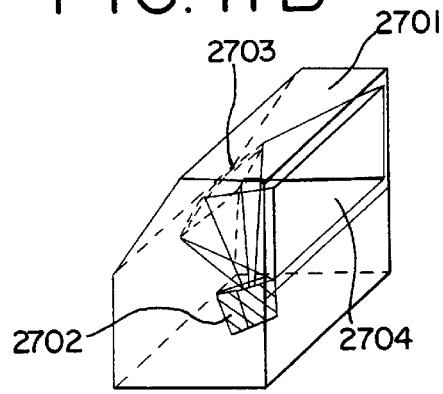

FIG. 11B is a rear type projector which comprises: a main body 2701; a projection system 2702; a mirror 2703; and a screen 2704. The present invention can be applied to the liquid crystal module 2808 which forms a part of the projection system 2702.

Figure 11C:
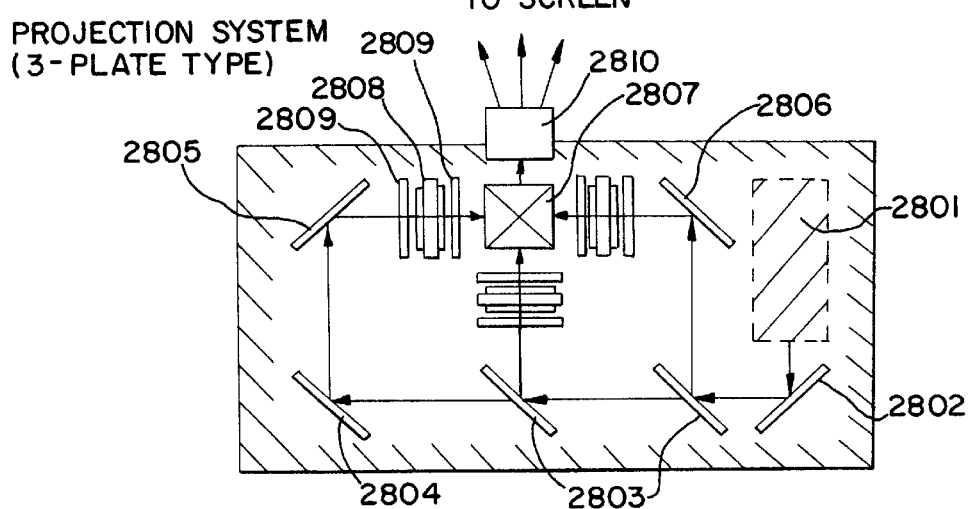

FIG. 11C is a diagram which shows an example of the structure of a projection system 2601 and 2702 in FIGS. 11A and 11B. Projection systems 2601 and 2702 comprise: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc in the optical path shown by an arrow in FIG. 11C.

Figure 11D:
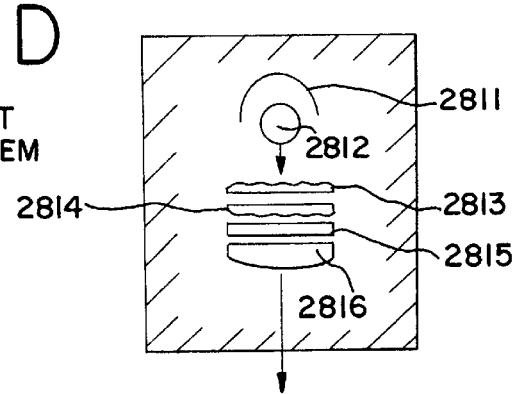

FIG. 11D is a diagram showing an example of a structure of an optical light source system 2801 in FIG. 11C. In the present embodiment the optical light source system 2801 comprises: a reflector 2811; a light source 2812; lens arrays 2813 and 2814; a polarizer conversion element 2815; and a collimator 2816. Note that the optical light source system shown in FIG. 11D is merely an example and the structure is not limited to this example. For instance, an operator may appropriately dispose an optical system such as an optical lens, a film that has a function to polarize light, a film that adjusts a phase difference or an IR film, etc.

Note that the projectors shown FIG. 11 are the cases of using a transmission type electro-optical devices, and applicable examples of a reflection type electro-optical device and an EL module are not shown.

FIG. 12A is a portable telephone which comprises: a main body 2901; a voice output section 2902; a voice input section 2903; a display section 2904; operation switches 2905; an antenna 2906; and an image input portion (CCD, image sensor etc.) 2907 etc. The present invention can be applied to the display section 2904.

FIG. 12B is a portable book (electronic book) which comprises: a main body 3001; display sections 3002 and 3003; a recording medium 3004; operation switches 3005 and an antenna 3006 etc. The present invention can be applied to the display sections 3002 and 3003.

FIG. 12C is a display which comprises: a main body 3101; a supporting section 3102; and a display section 3103 etc. The present invention can be applied to the display section 3103.

As described above, the applicable range of the present invention is very large, and the invention can be applied to electronic devices of various areas. Note that the electronic devices of the present embodiment can be achieved by utilizing any combination of constitutions in Embodiments 1 to 6.

According to the present invention, it is possible to realize the pixel TFT in which the off current value is extremely low, and the ratio of the on current value to the off current value is high. Accordingly, the semiconductor device having excellent display characteristics can be realized. Further, since the impurity region is formed by using the taper portion formed by etching, the number of steps can be reduced, and the reduction in manufacturing cost and the improvement in yield can be realized.

What is claimed is:

1. A semiconductor device comprising:
   a gate electrode provided over an insulating surface;
   an insulating film provided over the gate electrode; and
   a semiconductor layer provided over the insulating film,
   wherein the semiconductor layer includes a channel formation region provided adjacent to the gate electrode with said insulating film therebetween, and an impurity region formed to be in contact with the channel formation region, and
   wherein the impurity region has a concentration distribution in which as a distance from the channel formation region becomes larger, an impurity concentration is increased.

2. A device according to claim 1, wherein the impurity region has the concentration distribution in which as the distance from the channel formation region becomes larger, the impurity concentration is continuously increased.

3. A device according to claim 1, wherein the impurity region includes at least a region having a concentration gradient of the concentration distribution in a channel length direction.

4. A device according to claim 1, further comprising a first insulating film over the channel formation region, and a second insulating film provided so as to contact with the first insulating film, wherein the first insulating film includes a taper portion.

5. A device according to claim 1, wherein the taper portion of the first insulating film overlaps with a region having the concentration gradient in the impurity region.

6. A device according to claim 1, wherein the second insulating film overlaps with the channel formation region.

7. A device according to claim 1, wherein the impurity region overlaps with the gate electrode.

8. A device according to claim 1, wherein the impurity region does not overlap with the gate electrode.

9. A device according to claim 1, wherein the first insulating film comprises silicon nitride.

10. A device according to claim 1, wherein the second insulating film comprises silicon oxide.

11. A device according to claim 1, wherein the impurity concentration is a concentration of an impurity element imparting one conductivity type to a semiconductor.

12. A device according to claim 1 wherein the semiconductor device is a liquid crystal module.

13. A device according to claim 1 wherein the semiconductor device is an EL module.

14. A device according to claim 1 wherein the semiconductor device is one selected from a group consisting of a video camera, a digital camera, a projector, a goggle type display, a car navigation system, a personal computer, a portable information terminal, a digital video disk player, and an electronic play instrument.

15. A method of manufacturing a semiconductor device, comprising:
   forming a gate electrode over an insulating surface;
   forming a gate insulating film over the gate electrode;
   forming a semiconductor layer over the gate insulating film;
   forming an insulating film over the semiconductor layer;
   forming an insulating layer having a taper portion over the semiconductor layer by etching the insulating film formed over the semiconductor layer; and
   forming an impurity region in which an impurity concentration is increased toward an end portion of the taper portion, by adding an impurity element imparting one conductivity type to the semiconductor layer through the taper portion.

16. A method of manufacturing a semiconductor device, comprising:
   forming a gate electrode over an insulating surface;
   forming a gate insulating film over the gate electrode;
   forming a semiconductor layer over the gate insulating film;
   forming a first insulating film over the semiconductor layer;

forming a second insulating film over the first insulating film;

forming a resist mask over the second insulating film;

forming a second insulating layer covering a portion which becomes a channel formation region by selectively etching the second insulating film while forming a first insulating layer having a taper portion over the semiconductor layer by selectively etching the first insulating film;

adding an impurity element imparting one conductivity type to the semiconductor layer while the resist mask is used as a mask; and forming an impurity region in which an impurity concentration is increased toward an end portion of the taper portion, by adding an impurity element imparting one conductivity type to the semiconductor layer through the taper portion after the resist mask is removed.

17. A method according to claim 16, wherein at the step of forming the resist mask, the resist mask is formed by exposure from a back side of a substrate while the gate electrode is used as a mask.

18. A method according to claim 16 wherein the first insulating film comprises silicon nitride.

19. A method according to claim 16 wherein the second insulating film comprises silicon oxide.

20. A method according to claim 16 wherein the semiconductor device is one selected from a group consisting of a video camera, a digital camera, a projector, a goggle type display, a car navigation system, a personal computer, a portable information terminal, a digital video disk player, and an electronic play instrument.

* * * * *